United States Patent
Wetzel et al.

(10) Patent No.: US 7,859,852 B2
(45) Date of Patent: Dec. 28, 2010

(54) CONTROLLER, IN PARTICULAR FOR MOTOR VEHICLE TRANSMISSIONS

(75) Inventors: Gerhard Wetzel, Korntal-Muenchingen (DE); Peter Sprafke, Stuttgart (DE); Ulrich Trescher, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 474 days.

(21) Appl. No.: 11/720,801

(22) PCT Filed: Aug. 9, 2006

(86) PCT No.: PCT/EP2006/065172

§ 371 (c)(1),
(2), (4) Date: Jun. 4, 2007

(87) PCT Pub. No.: WO2007/036384

PCT Pub. Date: Apr. 5, 2007

(65) Prior Publication Data

US 2010/0149763 A1   Jun. 17, 2010

(30) Foreign Application Priority Data

Sep. 29, 2005   (DE) .................. 10 2005 046 826

(51) Int. Cl.
*H05K 1/00*   (2006.01)
(52) U.S. Cl. .................. 361/749; 361/790; 361/752
(58) Field of Classification Search .................. 361/720, 361/736, 748, 749, 752, 760, 780, 797, 800, 361/816, 818, 730, 799; 220/200, 260, 265, 220/277, 279, 258.1, 258.2, 256.1
See application file for complete search history.

(56) References Cited

U.S. PATENT DOCUMENTS

| | | | |
|---|---|---|---|
| 4,443,145 A | | 4/1984 | Peschges |
| 5,099,396 A | * | 3/1992 | Barz et al. .................. 361/818 |
| 5,883,791 A | * | 3/1999 | Deguchi .................. 361/818 |
| 6,241,331 B1 | | 6/2001 | Kammerl et al. |
| 6,570,773 B1 | * | 5/2003 | Loibl et al. .................. 361/752 |
| RE39,272 E | * | 9/2006 | Loibl et al. .................. 174/549 |
| 7,375,966 B2 | * | 5/2008 | Murakami et al. .......... 361/707 |
| 7,656,674 B2 | * | 2/2010 | Wetzel et al. .................. 361/752 |
| 2003/0112587 A1 | | 6/2003 | Krause et al. |

FOREIGN PATENT DOCUMENTS

| | | |
|---|---|---|
| DE | 83 09 870 | 10/1983 |
| DE | 198 56 839 | 6/2000 |
| DE | 100 51 945 | 11/2001 |
| DE | 201 20 373 | 9/2002 |
| DE | 103 15 432 | 10/2004 |
| EP | 0 973 366 | 1/2000 |
| EP | 1 239 710 | 9/2002 |
| JP | 04056173 | 2/1992 |
| WO | 2004/091270 | 10/2004 |

* cited by examiner

*Primary Examiner*—Hung S Bui
(74) *Attorney, Agent, or Firm*—Michael J. Striker

(57) ABSTRACT

In a controller, in particular for motor vehicle transmissions, having a holder (1) on which an electronic circuit component (2) and at least one flexible printed-circuit film (3) connected to the electronic circuit component (2) by means of electric connection means (7) are arranged, it is proposed to arrange on the holder (1) a frame component (5) which surrounds the electronic circuit component (2), and to connect the electric connection means (7) connected to the electronic circuit component electrically to the at least one flexible printed-circuit film (3), through at least one opening (15) in the frame component (5).

12 Claims, 4 Drawing Sheets

CONTROLLER, IN PARTICULAR FOR MOTOR VEHICLE TRANSMISSIONS

RELATED ART

Figure 1:
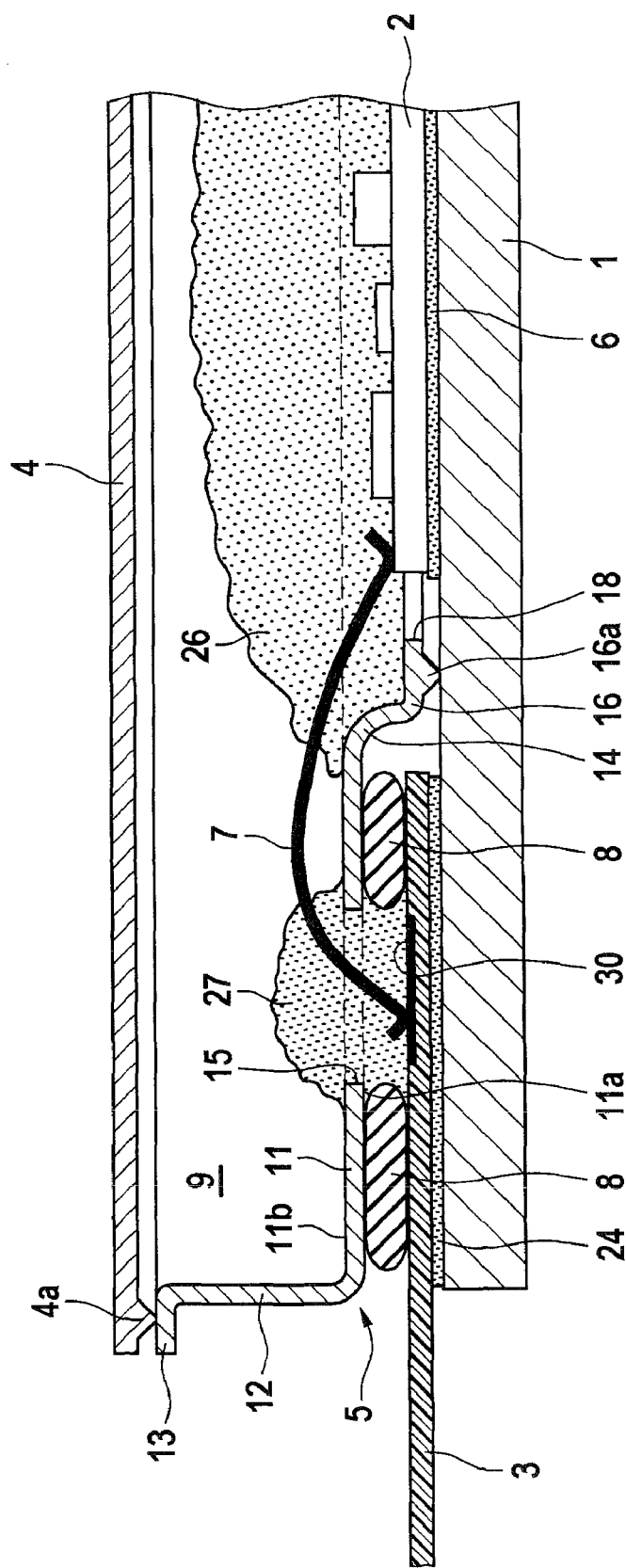

The present invention relates to a controller with the features of the preamble of independent Claim 1.

Controllers are known in automotive engineering that are used to control transmissions and are installed in a control module that is equipped with sensors, plug-in connections, and hydraulic valves if necessary, and is mounted on the transmission. The controller is exposed to automatic transmission fluid (ATF), which is aggressive, and to high temperatures. An electronic circuitry part that is responsible for the control functions to must therefore be located in an oil-tight housing interior of the controller. A controller with the features listed in the preamble of Claim 1 is made known, e.g., in EP 1 239 710 A2. With the known controller, the electronic circuitry part is mounted on a metallic carrier part, which is located on a heat sink. A large-area, flexible conductive foil that encloses the circuitry part is laminated on the carrier part. To this end, the conductive is foil includes an inner recess in which the circuitry part is located on the carrier part. A housing cover provided with sealing means is placed on the large-area conductive foil to seal the circuitry part. The disadvantage of the known controller is the use of a large-area and, therefore, expensive conductive foil, and the special method for sealing the housing interior, which is partly accomplished via the conductive foil, which extends into the housing interior. It is relatively challenging to prevent leaks between the conductive foil and the carrier part, and between the conductive foil and the housing cover.

ADVANTAGES OF THE INVENTION

The inventive controller with the characterizing features of Claim 1 makes it possible to realize a cost-favorable design with a tight seal against aggressive transmission substances and strong resistance to high temperatures. A large-area, expensive conductive foil can be advantageously eliminated. Several flexible conductive foil strips can be used instead, which can be manufactured cost-favorably in panels, since there is little blanking waste. By using a frame part that encloses the electronic circuit and is connectable with the carrier in a circumferential sealing region, the housing interior is sealed off in a particularly reliable manner. According to the present invention, the electrical connection means provided with the electronic circuitry part are contacted with the at least one conductive foil located outside of the housing interior, through at least one opening in the frame part. The housing interior is therefore not sealed via the conductive foil, and the seal can therefore be advantageously realized using a welded connection between the frame part and the carrier.

Advantageous exemplary embodiments and refinements of the present invention are made possible by the features indicated in the dependent claims.

The side of the frame part opposite the carrier can be closed with a housing cover, thereby resulting in a sealed-off housing interior. The housing interior can be sealed advantageously using a welded connection between the frame part and the housing cover.

In an advantageous exemplary embodiment, the frame part bears via a circumferential support region against the side of the carrier on which the electronic circuitry part is provided, outside of the electronic circuitry part. In this circumferential region, the frame part can be easily connected with the carrier, e.g., via welding.

According to a particularly advantageous exemplary embodiment, the frame part includes a first wall section with a first side facing the carrier, and a second side facing the housing interior, and a second wall section that extends from the first wall section toward the housing cover. The frame part has a tub-like shape. This shape is very helpful in terms of applying a covering material, e.g., a gel, on the electronic circuit.

The at least one recess can be formed in the first wall section of the frame part in particular; this first wall section bears directly or indirectly on the flexible conductive foil. In this case, the circuitry part and the conductive foil are oriented in parallel on the carrier, and the connection means—in the form of bonding wires—can be easily installed on the conductive foil located outside of the housing interior, through the opening.

To seal the opening, it is provided that the first wall section of the frame part rests on the flexible conductor foil, separated by sealing means that enclose the at least one opening and a contact surface of the flexible conductor foil. Various sealing means can be used in this case, e.g., adhesion seals or compression seals in particular.

In another exemplary embodiment it is provided that the first wall section rests on the flexible conductor foil, separated by a spacer provided with an inner recess for passage of the electrical connection means; the sealing means are located around the spacer, between the first wall section and the conductor foil. The spacer, which is made of plastic, for example, can be pressed into the recess and serves as an installation aid for the sealing means and for adjusting the distance between the first wall section and the conductive foil. If an elastic sealing ring is used as the sealing means, it is compressed by an amount defined by the height of the spacer holder.

The inventive controller can be manufactured very easily by first installing the at least one conductive foil on the carrier. If several flexible conductive foil strips are used, they can be located on the same carrier with narrow tolerances. The frame part is then placed on the carrier, and the opening in the frame part can be sealed by placing a sealing means between the frame part and the carrier. The frame part can be attached to the carrier using a welded connection. The electronic circuitry part can then be placed inside the frame part on the carrier, and it can be attached thereto. The circuitry part can also be located on the carrier before the frame part or conductive track are installed. Finally, the electrical connection means can be contacted with the electronic circuitry part and the flexible conductive foil. This can take place advantageously in the form of bonding wire connections between the contact surfaces of the circuitry part and the conductive foil. A gel can be applied to the circuitry part and/or the recess, and the housing cover can then be placed on the frame part.

DRAWING

Exemplary embodiments of the present invention are shown in the drawing and are described in the description below.

Figure 2:
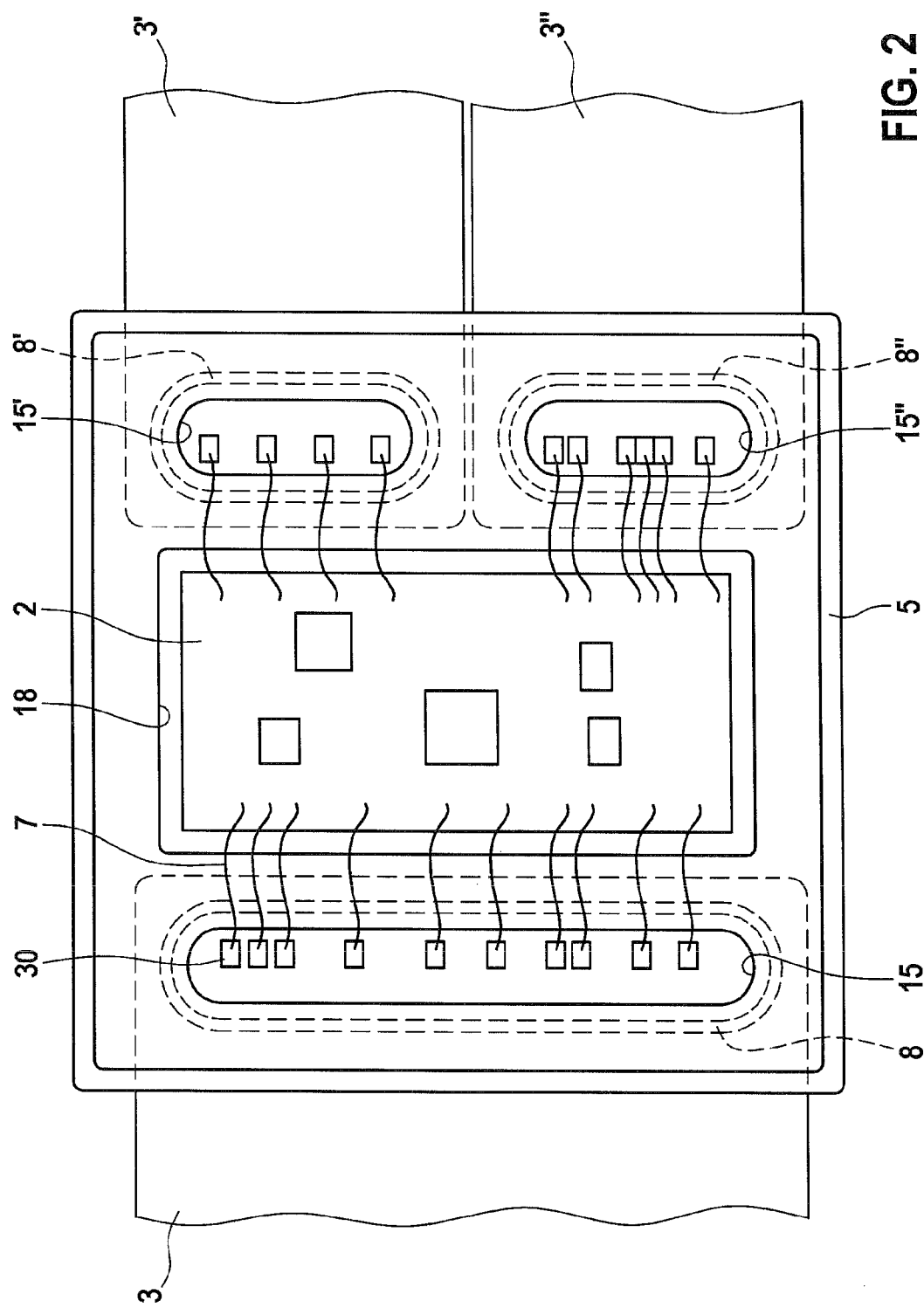
Figure 3A:
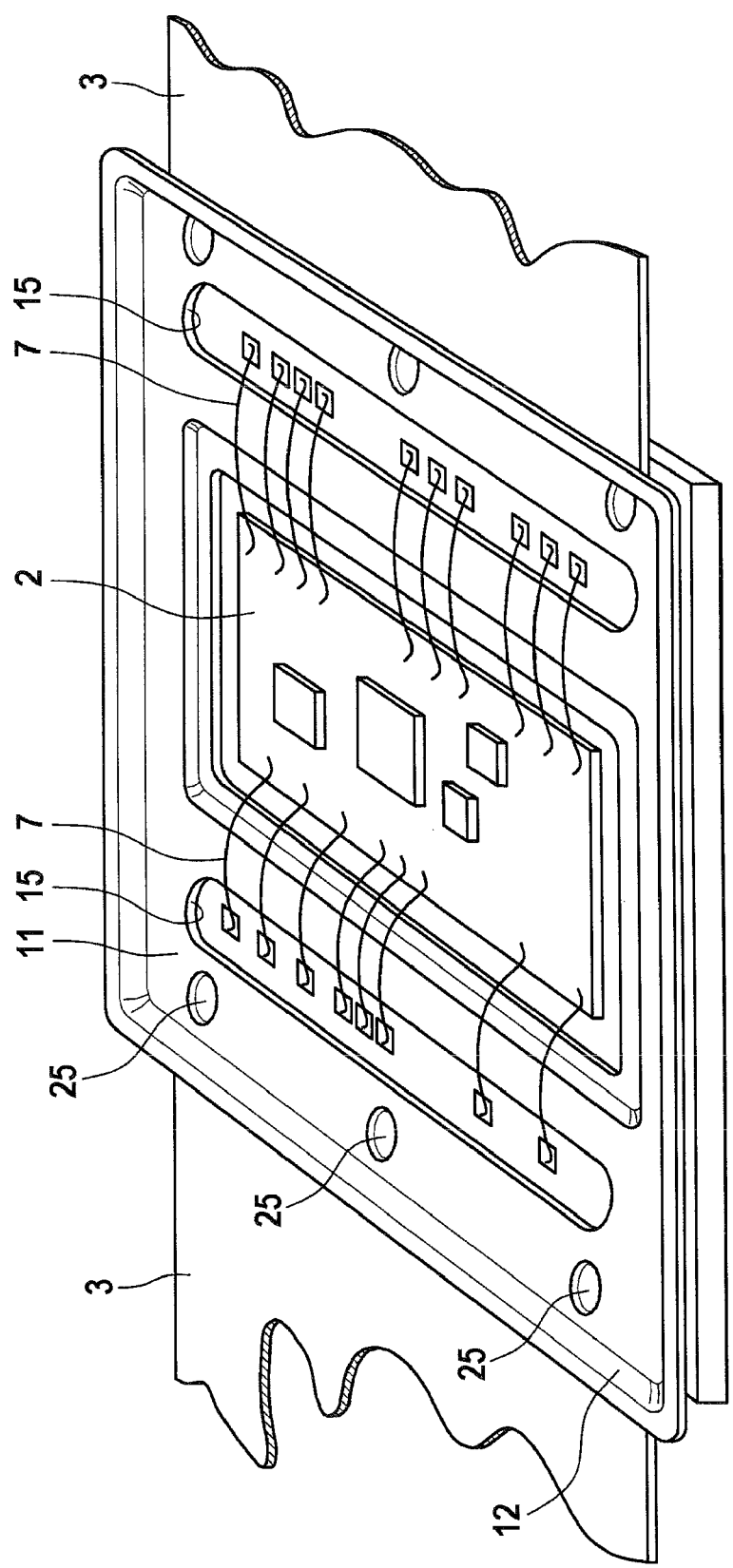
Figure 3B:
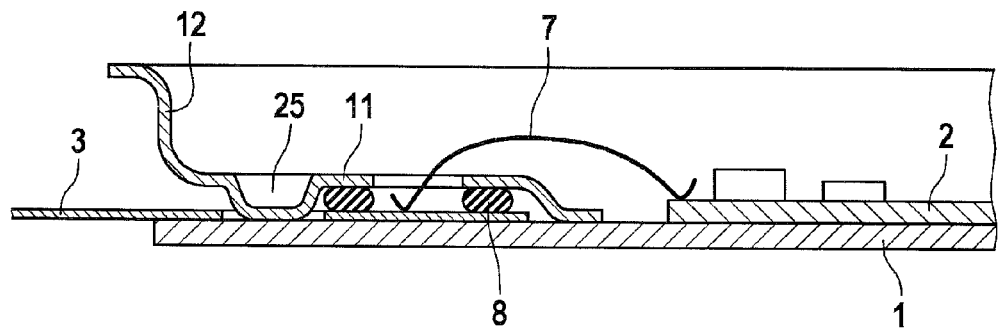
Figure 4:
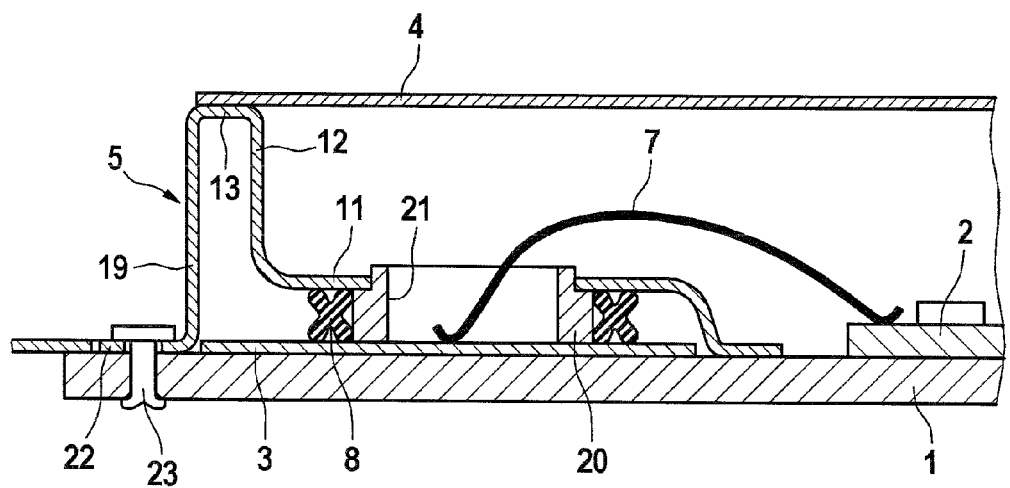

FIG. 1 shows a partial cross section through a first exemplary embodiment of the present invention, FIG. 2 shows a top view of the first exemplary embodiment with the housing cover removed, FIG. 3a shows a perspective view of a second exemplary embodiment, FIG. 3b shows a partial cross section through FIG. 3a, FIG. 4 shows a partial cross section through a third exemplary embodiment of the present invention.

DESCRIPTION OF THE EXEMPLARY EMBODIMENTS

A first exemplary embodiment of the inventive controller is shown in FIG. 1. The controller is, e.g., a transmission controller, which can be installed in a control module mounted on the transmission. The controller includes a carrier 1, which is designed, e.g., as a flat metallic carrier plate made of steel or aluminium with good heat dissipation. Carrier 1 can be attached to the not-shown control module, where it is connected in a heat-dissipating manner with a heat sink of the module, in particular. FIG. 1 also shows that an electronic circuitry part 2 is mounted on carrier 1. Electronic circuitry part 2 includes an electronic circuit located on a carrier substrate, with electrical and/or electronic components that are required to control the transmission. The circuitry part is preferably designed as a LTCC (Low Temperature Cofired Ceramic) with a ceramic carrier substrate and is mounted on carrier 1, e.g., using an adhesive layer 6 or in another manner. As shown in FIGS. 1 and 2, at least one flexible conductive foil 3 is also laminated on carrier 1, using an adhesive 24. Advantageously, several flexible conductive foils 3, 3', 3" in strip form can be laminated onto the same carrier. By bonding conductive foils 3, 3', 3" on the flat installation side of a common carrier 1, it is possible to maintain a narrow positional tolerance of the conductive foils relative to each other. Flexible conductive foils 3, 3', 3" are contacted with electrical or electronic components of the control module at their ends opposite the carrier and which are not shown in FIGS. 1 and 2. The electrical or electronic components are, e.g., sensors, plug-in components, or hydraulic valves. The bonding of conductive foils 3, 3', 3" serves as the mechanical attachment to the carrier and as strain relief for the electrical connection points with circuitry part 2. Adhesive 24 also advantageously ensures that tensile forces do not act exclusively on the sealing means on the controller housing. The conductive foils can also be laminated on carrier 1 before circuitry part 2 is installed.

FIGS. 1 and 2 also show that, after the conductive foils are applied, a preferably metallic frame part 5 is placed on the carrier. The frame part can also be made of plastic. Frame part 5 has a tub-like shape with an inner recess 18, and is placed on carrier 1 such that the electronic circuitry part is located in inner recess 18 and circuitry part 2 is enclosed on four sides by frame part 5. Frame part 5 includes a first, essentially flat wall section 11, which is located nearly parallel with the side of carrier 1 on which circuitry part 2 is installed. First wall section 11 has a first side 11a facing carrier 1, and a second side 11b opposite thereto. The frame part also has a second wall section 12, which is positioned at a right angle relative to first wall section 11, forms a laterally circumferential boundary wall of the controller housing, and is provided with a collar 13. First wall section 11 is provided with openings 15, 15' and 15" for passage of electrical connection means 7. Sealing means 8, 8', 8" that enclose the particular opening are provided between first wall section 11 and conductive foils 3, 3', 3". The sealing means can be, e.g., an adhesive seal in the form of a circumferential ridge of sealing adhesive, which retains its shape after being applied to particular conductive foil 3, 3', 3", does not run, and has a viscosity that is low enough that the particular conductive foil and the frame part are completely covered in the sealing region after frame part 5 is installed. The quantity of sealing adhesive to be applied depends on the width and height of the gap between the conductive foil and frame part 5. Every sealing adhesive ridge 8, 8', 8" is applied on associated conductive foil 3, 3', 3" around the circumference of the region of the conductive foil provided with contact surfaces 30, as best shown in FIG. 2. Frame part 5 can then be installed and the sealing adhesive can be hardened.

A section 14 that is U-bent toward carrier 1 is located on the inner side of first wall section 11, which faces electronic circuitry part 2 and away from second wall section 12. A support region 16 that extends nearly parallel with the carrier abuts section 14. Support region 16 rests directly on the metallic carrier, e.g., with a rib 16a, and encircles inner recess 18. Frame part 5 can be attached to the carrier by welding support region 16 with carrier 1 in the region of rib 16a. The welding can be, in particular, resistance welding (capacitor discharge welding) or laser welding. It is advantageous that electronic circuitry part 2 is not placed on the carrier until frame part 5 is welded together with carrier 1, since this prevents the welding process from possibly damaging the sensitive circuitry part.

After frame part 5 is welded together with carrier 1 and circuitry part 2 is installed, bondlands of electronic circuitry part 2 are contacted with contact surfaces 30 of conductive foils 3, 3', 3" using electrical connection means 7 in the form of bonding wires. Aluminum bonds can be used for this purpose, for example. After the bonding wire connection is established, gel can be applied over the circuitry part. A first gel 26 (e.g., an economical standard gel) is applied on the circuitry part. Section 14 of frame part 5, which is U-bent toward carrier 1, forms a receptacle for the gel when it is applied, thereby preventing the gel from reaching first wall section 11. A second gel 27 with a different consistency (e.g., a highly resistant, fluorinated gel) can therefore be applied in the region of openings 15, 15', 15"; it fills the space enclosed by particular sealing means 8, 8', 8" over contact areas 30 to the level of particular opening 15, 15', 15", thereby protecting contact areas 30. U-bent section 14 prevents the first gel and the second gel from flowing into each other. First gel 26 and second gel 27 can be hardened together, and venting advantageously takes place via frame part 5, which has not yet been closed.

Finally, a housing cover 4 is placed on frame part 5. The housing cover includes a circumferential rib 4a, which comes to rest on collar 13 of frame part 5. Frame part 5 is welded with housing cover 4 in this region, thereby creating a closed housing interior 9. The housing cover can also be attached to the frame part in another manner. E.g., by crimping or adhesive sealing. Carrier 1, frame part 5, and housing cover 4 can be advantageously made of the same metallic material. Since the expansion coefficients are the same, the thermally induced stresses on the polymer seal between the conductive foil and the frame part are minimized.

A second exemplary embodiment is shown in FIG. 3a and FIG. 3b. In this exemplary embodiment, first wall section 11 of frame part 5—as viewed from the inside of the housing outward—is provided with recesses 25, which form projections on side 11a of first wall section 11 facing carrier 1 that extend toward the carrier, through openings in the conductive foils, and rest directly on carrier 1, with which they are welded together in order to mechanically attach frame part 5 to carrier 1.

A fourth exemplary embodiment is shown in FIG. 4. With this exemplary embodiment, a sleeve-type spacer 20 made of plastic is pressed into recess 15 of frame part 6. Spacer 20 is used to adjust the distance between first wall section 11 of frame part 5 and flexible conductive foil 3. Spacer 20 has an inner opening 21, through which electrical connection means 7 are contacted with contact surfaces 30 of conductive foil 3.

In this exemplary embodiment, sealing means 8 are designed as a compression seal in the form of a fluorinated elastomer, which is pushed onto spacer 20 with radial preload. The spacer therefore serves as an installation aid for sealing means 8, and serves to adjust a defined compression of sealing means 8.

A further wall section 19 of frame part 5 is also provided in this exemplary embodiment, which abuts collar 13, is U-bent toward carrier 1, and is provided with a U-bent section 22, which extends in parallel with carrier 1. Section 22 is attached to the carrier using fastening means 23, e.g., in the form of screws or rivets. Section 22 can also be welded together with carrier 1, of course, and the weld point can also be designed as shown in FIG. 3b.

When sealing means 8, 8', 8" are designed in the form of compression seals, it is also possible to inject the sealing means onto frame part 5, and/or to form them on the frame part via vulcanization. This is a further advantage. In addition to sealing means 8, it is also possible to design the seals between the frame part and the housing cover, or between the frame part and the carrier, as compression seals. Advantageously, the seals can be vulcanized separately from the conductive foil, thereby ensuring that reaction products do not impair the cleanliness of the contact surfaces of the conductive foil.

What is claimed is:

1. A controller, in particular for motor vehicle transmissions, with a carrier (1) on which an electronic circuitry part (2) and at least one flexible conductive foil (3) connected to the electronic circuitry part (2) via electrical connection means (7) are located,
    wherein
    a frame part (5) that encloses the electronic circuitry part (2) is located on the carrier (1), and the electrical connection means (7) connected with the electronic circuitry part are electrically connected with the at least one flexible conductive foil (3) through at least one opening (15) in the frame part (5).

2. The controller as recited in claim 1,
    wherein
    the frame part (5) is covered by a housing cover (4) on the side opposite the carrier (1);
    the frame part, housing cover, and the carrier form a housing interior (9) that contains the electronic circuitry part (2).

3. The controller as recited in claim 2,
    wherein
    the flexible conductive foil (3) is located outside of the housing interior (9) formed by the frame part (5), the housing cover (4), and the carrier (1).

4. The controller as recited in claim 1,
    wherein
    the frame part (5) bears via a circumferential support region (16) against the side of the carrier (1) on which the electronic circuitry part (2) is provided, outside of the electronic circuitry part, and is welded there around the circumference, with the carrier (1) in particular.

5. The controller as recited in claim 1,
    wherein
    the frame part (5) includes a first wall section (11) with a first side (11a) facing the carrier, and a second side (11b) facing the housing interior (9), and a second wall section (12) that extends from the first wall section (11) toward the housing cover (4).

6. The controller as recited in claim 5,
    wherein
    the at least one opening (15) is provided in the first wall section (11) of the frame part (5), and the first wall section (11) bears at least directly on the flexible conductive foil (3).

7. The controller as recited in claim 6,
    wherein
    the first wall section (11) of the frame part (5) rests on the flexible conductive foil, separated by sealing means (8) that enclose the at least one opening (15) of the frame part and a contact surface (30) of the flexible conductive foil (3).

8. The controller as recited in claim 7,
    wherein
    the first wall section (11) rests on the flexible conductive foil (3), separated by a spacer (20) provided with an inner recess (21) for passage of the electrical connection means (7); the sealing means (8) are located around the spacer (20), between the first wall section (11) and the conductive foil.

9. The controller as recited in claim 1,
    wherein
    the frame part (5) includes at least one section (16, 25) that is welded with the carrier (1).

10. The controller as recited in claim 1,
    wherein
    several flexible conductive foils (3, 3', 3") are located on the carrier (1), to each of which an opening (15, 15', 15") in the frame part is assigned; the connection means (7) connected with a conductive foil are electrically connected with the circuitry part (2) through the opening (15, 15', 15") assigned to the particular conductive foil.

11. The controller as recited in claim 1,
    wherein
    the electrical connection means (7) are designed as bonding wires.

12. A method for manufacturing a controller as recited in claim 1,
    wherein,
    in a first step, the at least one conductive foil (3) is mounted on the carrier (1), the frame part (5) is then placed on the carrier and attached to the carrier using a welded connection, the electrical connection means (7) are then contacted with the flexible conductive foil (3) and an electronic circuitry part (2) attached before or after the frame part is mounted on the carrier (1), and the housing cover (4) is placed on the frame part (5).

* * * * *